United States Patent [19]

Suski

[11] Patent Number: 5,300,899
[45] Date of Patent: Apr. 5, 1994

[54] THIN, FLEXIBLE, STRIPLINE FLEX CABLE HAVING TWO SHIELDING GROUND PLANES FORMED AS GRIDS HAVING MUTUALLY OFFSET GRID PATTERNS

[75] Inventor: Edward D. Suski, Lake Forest, Calif.

[73] Assignee: AST Research, Inc., Irvine, Calif.

[21] Appl. No.: 12,547

[22] Filed: Feb. 2, 1993

[51] Int. Cl.$^5$ .............................................. H01P 3/08
[52] U.S. Cl. .................................... 333/1; 174/254; 333/238
[58] Field of Search .................. 333/1, 236, 238, 243, 333/246; 174/36, 102 SP, 117 F, 117 FF, 117 M, 250, 254

[56] References Cited

U.S. PATENT DOCUMENTS

| | | | |
|---|---|---|---|
| 3,612,744 | 10/1971 | Thomas | 333/238 X |
| 3,634,782 | 1/1972 | Marshall | 333/1 |
| 3,700,825 | 10/1972 | Taplin et al. | 174/117 F X |
| 4,642,592 | 2/1987 | Beeck | 333/246 |
| 4,644,092 | 2/1987 | Gentry | 174/36 |

Primary Examiner—Paul Gensler
Attorney, Agent, or Firm—Knobbe, Martens, Olson & Bear

[57] ABSTRACT

A shielded flexible cable includes a first shielding grid having conductive elements formed as squares. A second shielding grid is also formed as squares. The two shielding grids are positioned with respect to each other so that the vertices of the squares of the two grids are respectively offset from each other in each of two directions by one-half the diagonal distance between the vertices of the squares. Electrical signal conductors are positioned between the two grids along lines extending between the vertices of the squares to maintain a controlled impedance of the signal lines.

14 Claims, 3 Drawing Sheets

THIN, FLEXIBLE, STRIPLINE FLEX CABLE HAVING TWO SHIELDING GROUND PLANES FORMED AS GRIDS HAVING MUTUALLY OFFSET GRID PATTERNS

BACKGROUND OF THE INVENTION

1. Field of the Invention

The present invention relates generally to circuit boards, and, more particularly, to an apparatus and method for obtaining a thin, flexible stripline flex cable with shifted, symmetrical, cross-hatched reference planes.

2. Description of the Prior Art

Microstrips are extensively used to form flexible cables to interconnect high-speed logic circuits in digital computers because they can be fabricated by automated techniques and can provide the required impedance-controlled signal paths. However, microstrip construction permits significant levels of extraneous electromagnetic radiation. Stripline construction can be utilized to greatly reduce unwanted electromagnetic radiation. However, the addition of a second reference or ground layer results in increased capacitive coupling between the signal conductor and the reference planes, thus greatly reducing the impedance of the signal conductor. In order to maintain the desired impedance, the distance between reference layers and the signal conductor in traditional stripline construction must be greater than in microstrip construction. This increased thickness significantly reduces the cables' ability to withstand multiple flexures.

Typically conductors are formed in planes in the flexible cable. Ground planes or other reference voltage planes are positioned in planes parallel to the conductor planes to control the impedance of the conductors and to block the transmission of electromagnetic radiation from conductors carrying high frequency signals, such as clock signals and high speed data signals found in digital computers. In printed circuit boards, and the like, solid ground planes are generally used. However, solid ground planes are inflexible unless made very thin, and thus cannot be readily used to protect signal lines in cables that are intended to be frequently flexed, for instance, in the signal lines between the base and the movable display screen of a notebook computer. Furthermore, because of the large capacitance of a solid ground plane formed close to a signal line, the impedance of the signal lines may be lower than desired. On the other hand, if the ground plane is spaced further apart from the conductors to reduce the capacitance and thereby increase the impedance, the flexible cable becomes thicker and thus less flexible and more likely to break with repeated flexing.

Reference planes having conductive elements formed in a grid have been utilized in microstrip designs to increase the impedance and to provide flexibility. However, because the grid is not continuous like a solid reference plane, it has been found to be quite difficult to control the impedance of signal lines protected by a gridded reference plane because of the uncontrolled orientation of the signal lines with respect to the shielding grid. It is thus a goal of the present invention to provide a circuit board that provides effective shielding and having a controllable characteristic impedance.

One of the particular difficulties in controlling the impedance characteristics of flexible cables utilizing cross-hatched reference planes, especially cables of stripline construction, has been in the structure of turns in the cable. For example, when a flexible cable has a branch of 90 degrees, or the like, the orientation of the signal lines with respect to the shielding grid varies as the signal lines change direction, thus causing significant changes in the impedance of the signal lines. Thus, another goal of the present invention is to provide a means of reorienting signal lines which minimizes impedance discontinuities.

Accordingly, there is a need in the art to provide a circuit board having flexible reference planes, capable of thousands of flexures in a stripline design, and achieving a desired impedance that permits transfer of the signals without degradation to the signal quality while providing an acceptable shielding capability.

SUMMARY OF THE INVENTION

One aspect of the present invention is a circuit board that comprises a first shielding grid having a first predetermined configuration comprising conductive elements interconnected in a geometric pattern. The circuit board further comprises a second shielding grid having a second predetermined configuration substantially identical to the first predetermined configuration. The second grid is aligned at a predetermined offset from the first grid. A conducting element is positioned between the first and second grids so that the conductor is positioned at a predetermined location with respect to the first and second grids. In preferred embodiments, the geometric pattern is a square.

A second aspect of the present invention is a method of constructing a flexible circuit board having shielded electrical signal conductors. The method comprises the steps of positioning a first shielding grid with a first predetermined configuration on one side of the signal conductors in a first plane. The configuration comprises a plurality of intersections of conductive elements. The method comprises the further step of positioning a second shielding grid with a second predetermined configuration substantially equal to the first predetermined configuration on an opposite side of the signal conductors in a second plane parallel to the first plane. The second grid is aligned with respect to the first grid so that intersections of conductive elements of the second grid have a predetermined offset from intersections of conductive elements of the second grid. The method comprises the further step of orienting the signal conductors along lines parallel to lines connecting the intersections of conductive elements of the grids.

A still further aspect of the present invention is a circuit board that comprises a first shielding grid with a first predetermined configuration defined in a first plane and a second shielding grid with a second predetermined configuration defined in a second plane. The second shielding grid is positioned with respect to the first shielding grid along a predetermined offset. The second circuit board further comprises a conducting element positioned between the first and second grids so that the conductor is positioned at a predetermined location with respect to the first and second grids.

Another aspect of the present invention is a method of constructing a circuit board, comprising the steps of positioning a first shielding grid with a first predetermined configuration in a first plane, positioning a second shielding grid with a second predetermined configuration in a second plane parallel to the first plane, and offsetting the second shielding grid from the first shielding grid in a predetermined direction in the second plane. The method comprises the further step of positioning a conducting element between the first and second grids so that the conductor is positioned at a predetermined location with respect to the first and second grids.

Another aspect of the present invention is a shielded flexible cable comprising a first shielding grid comprising a first plurality of conductive elements oriented in a first direction and a second plurality of conductive elements oriented in a second direction perpendicular to the first direction so that the first plurality of conductive elements and the second plurality of conductive elements form a plurality of squares. The squares have vertices corresponding to the intersections of the first and second pluralities of conductive elements. The vertices have a diagonal distance therebetween along diagonal directions at 45 degrees to the first and second directions. The flexible cable has a second shielding grid structurally identical to the first shielding grid. The second shielding grid is positioned substantially parallel to the first shielding grid so that the intersections of the conductive elements of the first shielding grid are spaced apart from the intersections of the second shielding grid in the diagonal directions by a distance substantially equal to one-half the diagonal distance. A plurality of signal conductors are positioned between the shielding grids and oriented in a direction substantially parallel to one of the diagonal directions. Preferably, the signal conductors are oriented to proximate to the vertices of the squares.

DETAILED DESCRIPTION OF THE PREFERRED EMBODIMENT

Figure 1:
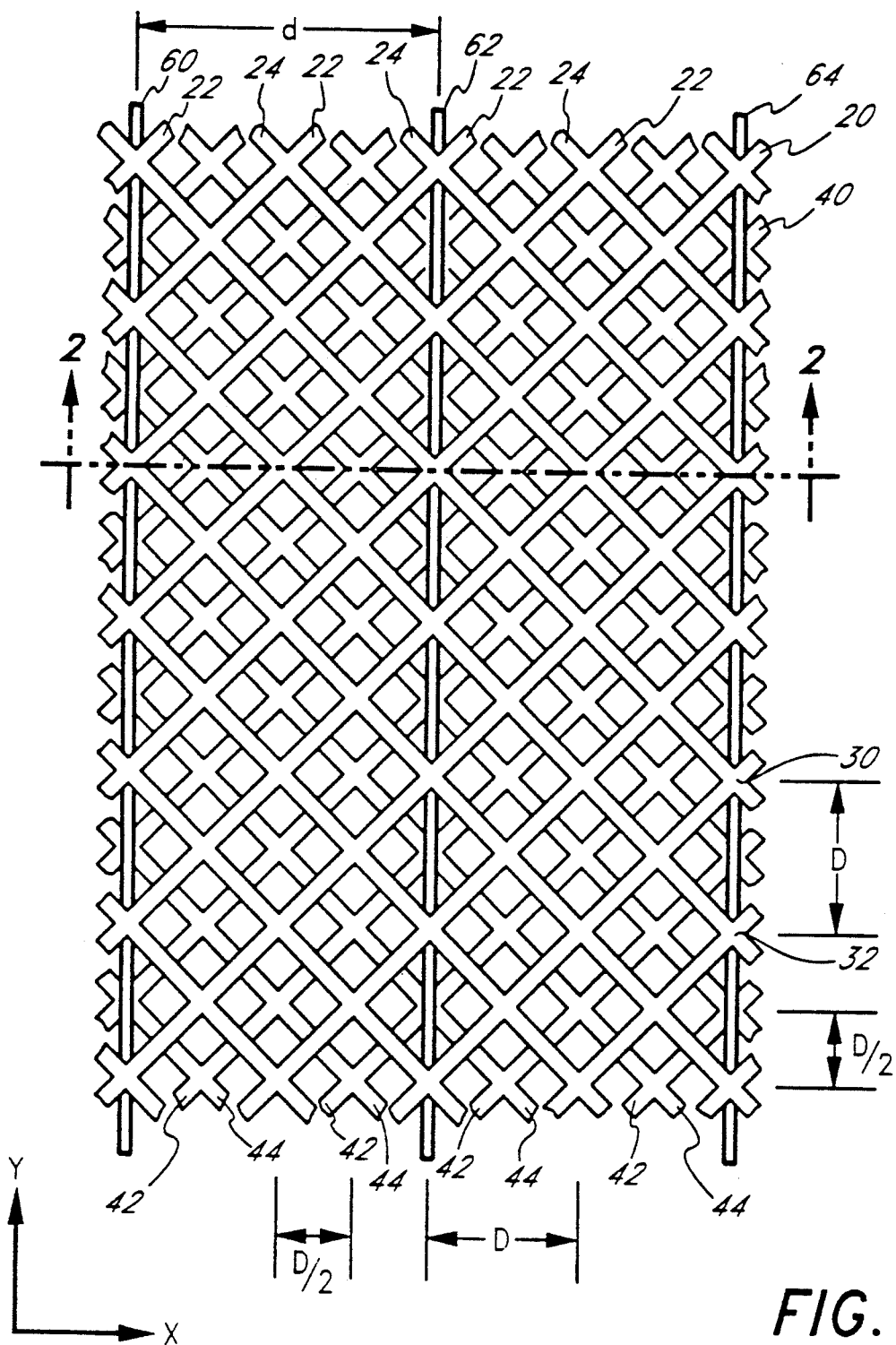
FIG. 1 is a plan view of a shielded flexible cable in accordance with the present invention.

As illustrated in FIG. 1, the circuit board 10 of the present invention comprises an upper shielding grid 20 comprising a set of electrically conductive elements, a lower shielding grid 40 comprising a like set of electrically conductive elements, and a plurality of signal conductors 60, 62, 64, all of which are aligned in predetermined locations with respect to one another as will be described below.

As illustrated in FIG. 1, each of the shielding grids 20, 40 has a uniform pattern, which in the preferred embodiment, is selected to be a repeating pattern of squares formed by the electrically conductive elements 22, 24 and 42, 44, respectively, that form the grids 20, 40. As illustrated, in the preferred embodiment, the elements 22 of the upper grid 20 are perpendicular to the elements 24, and the elements 42 of the lower grid 40 are perpendicular to the elements 44. Preferably, the grids 20 and 40 are formed by printed circuit board etching techniques by removing copper or other conductive material from a printed circuit board blank such that the conductive material remaining after etching forms the conductive elements 22, 24, 42, 44.

In particular, for reasons set forth below, the squares are oriented at 45 degrees with respect to the principle orientation of the signal conductors 60, 62, 64 such that the electrically conductive elements appear as crosshatching with respect to the signal conductors 60, 62, 64.

Each of the grid squares has four vertices formed by the intersection of two of the electrically conductive elements 22, 24 or 42, 44 of the respective grids 20, 40. The diagonal distance between two oppositely disposed vertices, for example, a pair of vertices 30 and 32 of the upper grid 20, forms the greatest open distance D between any two conductive elements. The distance D can be considered as the size of a slot in the shielding. As is well known in the art of shielding electrical signals, if the slot size D is the largest opening of the grid, and if the distance is less than one-half the wavelength of the highest signal frequency propagating in any of the signal conductors 60, 62, 64, then the shielding grids 20, 40 form an effective barrier to the emission of electromagnetic energy from the signal conductors 60, 62, 64. It should be understood that an electrical clock signal having a frequency of 100 MHz, for example, will have harmonics of many times that frequency. The harmonics of the highest signal frequency are considered when selecting the maximum allowable spacing for the electrically conductive elements of the shielding grids 20, 40. In the preferred embodiment, the distance D is selected to be less than 1/20 the size of the smallest expected wavelength of the signal traveling through the signal conductors 60, 62, 64.

Figure 2:
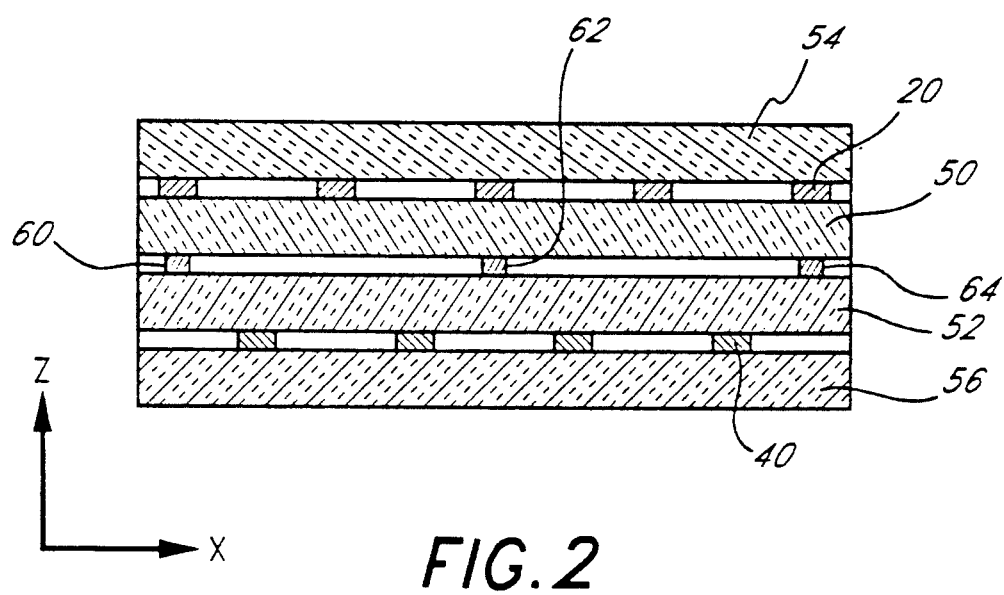
FIG. 2 is a cross-sectional elevational view of the present invention taken along the lines 2—2 in FIG. 1.

As illustrated in FIG. 2, the signal conductors 60, 62, 64 are located between the grids 20, 40 and are electrically insulated from the grids 20, 40 by an upper insulator 50 and a lower insulator 52. The upper surface of the upper grid 20 is laminated with an insulator 54. The bottom surface of the lower grid 40 is laminated with an insulator 56. The layers are sandwiched together and held in place by suitable adhesives known to the art. Preferably, the upper insulator 50 and the lower insulator 52 comprise an electrical insulator formed using a Z LINK ® insulator from Sheldahl, Inc., of Northfield, Minn. The Z LINK insulator has the advantage that it is self-adhesive and that by suitable manufacturing techniques, electrical interconnections can be formed in the Z LINK insulator to interconnect the shielding grids, 20, 40 together and/or to selected signal conductors 60, 62, 64 to ground the selected conductors. Such selected grounding is not part of the present invention and is not illustrated herein.

In order to more fully understand the following description, it is helpful to establish an X, Y, Z coordinate system for the drawing figures. The X and Y axes lie in a horizontal plane as shown in FIG. 1. Each of the upper grid 20 and the lower grid 40 are in planes parallel to the horizontal plane. Similarly, the signal conductors 60, 62, 64 line in a plane between and parallel to the planes of the two grids 20, 40. The principal orientations of the signal conductors 60, 62, 64 are parallel to the Y axis, as illustrated in FIG. 1, or parallel to the X axis except when the orientation of the conductors are in transition between the principal orientations. The Z axis is perpendicular to the X and Y axes as shown in FIG. 2.

As illustrated in FIG. 1, the conductive elements of the upper grid 20 and the lower grid 40 are oriented so that the elements are oriented at 45 degrees to the X axis and the Y axis and so that the diagonals of the squares formed by the conductive elements are parallel to the X axis or parallel to the Y axis.

Referring to FIGS. 1 and 2, although the upper grid 20 and the lower grid 40 have substantially identical structure, the two grids are not positioned in alignment as would be expected. Rather, the upper grid 20 and the lower grid 40 are offset with respect to each other so that a vertex of a square in the upper grid 20 is offset from the nearest vertex of a square in the lower grid 40 by a distance of D/2 in both the X direction and the Y direction. Although the offset may be larger than or less than D/2, an off-set of D/2 provides the maximum control of the impedance in the present invention. In particular, it can be seen that no conductive element of the upper grid 20 lies directly over, in the Z direction, any conductive element of the lower grid 40 for any significant distance. Rather, the conductive elements of the upper grid 20 cross the conductive elements of the lower grid 40 at right angles so that a minimal amount of capacitance is formed between the two grids 20, 40 at the intersections.

As further illustrated in FIG. 1, the signal conductors 60, 62, 64 are preferably positioned so that the signal conductors 60, 62, 64 extend from vertex to vertex of the squares defined by the conductive elements of the upper and lower grids 20, 40. With the signal conductors 60, 62, 64 positioned in this manner, the signal conductors 60, 62. 64 pass beneath a vertex of the upper grid 20 and then pass over a vertex of the lower grid 40. Thus, the signal conductors 60, 62, 64 do not lie between the elements of the upper grid 20 and the lower grid 40 at any location. This maintains a minimal capacitance between the signal conductors 60, 62, 64 and ground at all locations. Furthermore, by positioning all the conductors in the same positions with respect to the conductive elements of the upper and lower grids 20, 40, the characteristic impedances of the electrical conductors 60, 62, 64 can be effectively matched with respect to each other.

The impedance of the signal conductors 60, 62, 64 is a function of resistance, conductance, capacitance and inductance as follows:

$$Z_0 = \sqrt{\frac{R - j\omega L}{G + j\omega C}} \quad (1)$$

where $Z_0$ is the characteristic impedance of the signal conductors, R is the resistance, G is the conductance, $\omega$ is the frequency in radians (i.e., $2\pi f$), j is $\sqrt{(-1)}$, L is the inductance and C is the capacitance of the signal conductors.

At high frequencies, the impedance is primarily determined by the capacitance and the inductance, and Equation (1) reduces to:

$$Z_0 = \sqrt{\frac{L}{C}} \quad (2)$$

Thus, by reducing the capacitance to the signal conductors 60, 62, 64, the impedance of the signal conductors can be maintained sufficiently high to match the characteristic impedance of other circuit paths in an electronics system, such as a notebook computer or the like. For example, it is often desirable to provide a characteristic impedance of 50 ohms, an impedance frequently used in high frequency clock circuits.

Where a plurality of signal conductors are positioned in close proximity, such as the signal conductors 60, 62, 64 in FIG. 1, the conductors are preferably offset with respect to each other by a distance d that is a multiple of one-half the diagonal distance D between the vertices of the squares formed by the conductive elements of the upper grid 20 and the lower grid 40. That is:

$$\text{Offset} = n\left(\frac{D}{2}\right) \quad (3)$$

where n is an integer. This same positional relationship between the signal conductors 60, 62, 64 is preferably maintained even if the signal conductors 60, 62, 64 are not positioned to cross the grids at the vertices of the squares. For example, if one conductor is positioned to pass a small distance from the vertices of the squares, the other conductors should pass the same distance from the vertices so that the impedances of the conductors are substantially equal.

To obtain a circuit board that is capable of thousands of flexures, the thickness of the flexible cable in the Z direction must be kept to a minimum. However, the grids must have a sufficient amount of metal to withstand repeated flexes, such as the opening and closing of the display of a notebook computer. In one preferred embodiment of the present invention, a flexible cable having an overall thickness of 0.0085 inches is formed with a spacing of 0.005 inches between the shielding grids 20, 40 and with the signal conductors 60, 62, and 64 positioned approximately in the middle between the two grids. With this thickness, it has been found that a grid having approximately 23% metal content (i.e., in each grid square, approximately 23% of the area is metal and approximately 77% of the area is open). This configuration provides an impedance of approximately 50 ohms.

For commercial purposes, it is desirable that the shielding provide an effectiveness of at least 20 decibels. It can be shown that the shielding effectiveness can be expressed as:

$$S = 20 \log\left(\frac{\lambda}{2l}\right) \quad (4)$$

With a 23% metal area, a spacing D of approximately 0.060 inches provides a shielding effectiveness of approximately 29 dB, well within the 20 dB required for commercial purposes.

Figure 3:
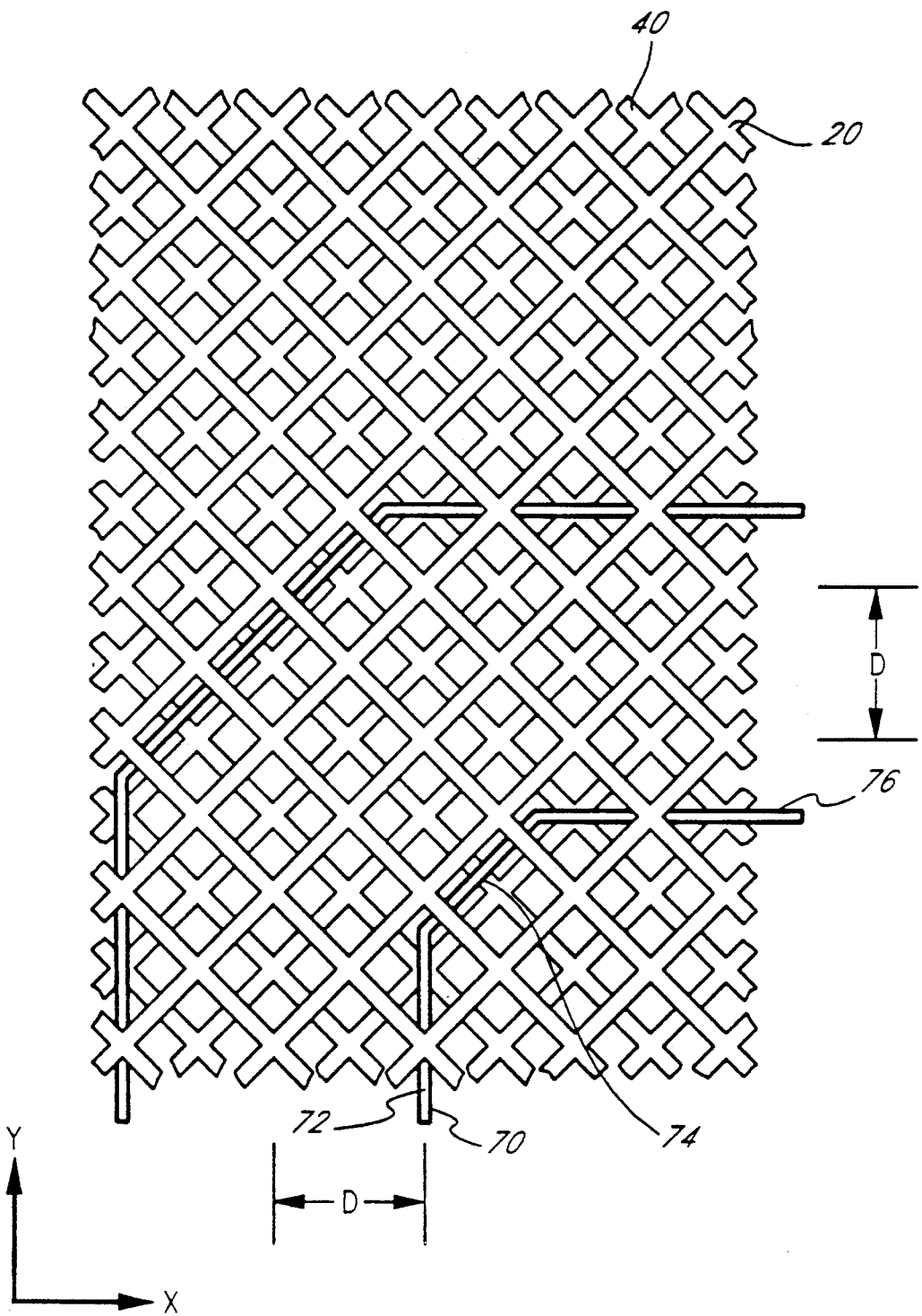
FIG. 3 is plan view of the shielded flexible cable of FIG. 1 showing a method of making a 90-degree turn in a signal conductor.

Occasionally, the signal conductors 60, 62, 64 have to be rerouted for a variety of reasons, for instance, to conform to design layouts or to make connections between ports that are not aligned along a line parallel to the Y axis. In such cases, the signal conductors 60, 62, 64 have to be reoriented to make such connections. As illustrated in FIG. 3, such changes in direction may be accomplished while keeping the impedance discontinuities of the signal lines to a minimum. To accomplish a ninety degree change in direction, a signal conductor 70 comprising a first section 72 is oriented along the vertices of the grids 20, 40 in a direction parallel to the Y axis. The first section 72 extends into a second section 74 which is oriented at 45 degrees with respect to the first section. The second section 74 then extends into a third section 76 which is oriented at 45 degrees with respect to the second section 74 and thus 90 degrees with respect to the first section 72. As illustrated, the first 45-degree turn in the signal conductor 70 occurs approximately halfway between a vertex of the upper grid 20 and a vertex of the lower grid 40. The second section 74 of the conductor 70 travels along a path parallel to but spaced apart from the conductive elements of both the upper grid 20 and the lower grid 40. The second 45-degree turn occurs substantially halfway between vertices of the upper and lower grids, 20, 40, and the third section 76 then propagates from vertex to vertex as before, but parallel to the X axis rather than the Y axis.

Although this invention has been described in terms of a certain preferred embodiment, other embodiments apparent to those of ordinary skill in the art are also within the scope of this invention. Accordingly, the scope of the invention is intended to be defined only by the claims which follow.

What is claimed is:

1. A circuit board, comprising:
a first shielding grid having a first predetermined configuration comprising conductive elements interconnected in a geometric pattern;
a second shielding grid having a second predetermined configuration substantially identical to said first predetermined configuration, said second grid being aligned at a predetermined offset from said first grid; and
a conducting element positioned between said first and second grids so that said conductor is positioned at a predetermined location with respect to said first and second grids.

2. The circuit board of claim 1, wherein said geometrical pattern comprises an opening between said conductive elements, and wherein a largest dimension of said opening is less than half a wavelength of a highest frequency of a signal conducted by said conducting element.

3. The circuit board of claim 2, wherein said largest dimension of said opening is less than one-twentieth of the wavelength the highest frequency of a signal conducted by said conducting element.

4. The circuit board of claim 3, wherein said circuit board further comprises a second conducting element.

5. The circuit board of claim 4, wherein said second conducting element is substantially parallel to said first conducting element.

6. The circuit board of claim 5, wherein said second conducting element is located at an offset of an integer multiple of half the distance of the largest dimension of said opening of said grid.

7. The circuit board of claim 6, wherein said offset is a factor of half the distance of the largest dimension of the opening of said grid.

8. The circuit board of claim 1, wherein said predetermined location of said conductor is determined by the vertices of said grids.

9. The circuit board as defined in claim 1, wherein said predetermined pattern is a square.

10. A method of constructing a flexible circuit board having shielded electrical signal conductors, comprising the steps of:
positioning a first shielding grid with a first predetermined configuration on one side of said signal conductors in a first plane, said configuration comprising a plurality of intersections of conductive elements;
positioning a second shielding grid with a second predetermined configuration substantially equal to said first predetermined configuration on an opposite side of said signal conductors in a second plane parallel to said first plane, said second grid being aligned with respect to said first grid so that intersections of conductive elements of said second grid have a predetermined offset from intersections of conductive elements of said second grid; and
orienting said signal conductors along lines parallel to lines connecting said intersections of conductive elements of said grids.

11. A circuit board, comprising:
a first shielding grid with a first predetermined configuration defined in a first plane;
a second shielding grid with a second predetermined configuration defined in a second plane, said second shielding grid being positioned from said first shielding grid along a predetermined offset; and
a conducting element positioned between said first and second grids so that said conductor is positioned at a predetermined location with respect to said first and second grids.

12. A method of constructing a circuit board, comprising the steps of:
positioning a first shielding grid with a first predetermined configuration in a first plane;
positioning a second shielding grid with a second predetermined configuration in a second plane parallel to said first plane and offsetting said second shielding grid from said first shielding grid in a predetermined direction in said second plane; and
positioning a conducting element between said first and second grids so that said conductor is positioned at a predetermined location with respect to said first and second grids.

13. A shielded flexible cable comprising:
a first shielding grid comprising a first plurality of conductive elements oriented in a first direction and a second plurality of conductive elements oriented in a second direction perpendicular to said first direction so that said first plurality of conductive elements and said second plurality of conductive elements form a plurality of squares, said squares having vertices corresponding to the intersections of said first and second pluralities of conductive elements, said vertices having a diagonal distance therebetween along diagonal directions at 45 degrees to said first and second directions;
a second shielding grid structurally identical to said first shielding grid, said second shielding grid positioned substantially parallel to said first shielding grid so that the intersections of said conductive elements of said first shielding grid are spaced apart from said intersections of said second shielding grid in said diagonal directions by a distance substantially equal to one-half said diagonal distance; and
a plurality of signal conductors positioned between said shielding grids and oriented in a direction substantially parallel to one of said diagonal directions.

14. The flexible cable as defined in claim 13, wherein said signal conductors are oriented to pass proximate to the vertices of said squares.

* * * * *